United States Patent
Carpenter

(12) 
(10) Patent No.: US 6,309,805 B1
(45) Date of Patent: Oct. 30, 2001

(54) METHOD FOR SECURING AND PROCESSING THIN FILM MATERIALS

(75) Inventor: Richard W. Carpenter, Johnson City, NY (US)

(73) Assignee: Morton International, Inc., Chicago, IL (US)

( * ) Notice: Subject to any disclaimer, the term of this patent is extended or adjusted under 35 U.S.C. 154(b) by 0 days.

(21) Appl. No.: 09/388,308

(22) Filed: Sep. 1, 1999

(51) Int. Cl.[7] .............................. G03F 7/34; G03C 1/805
(52) U.S. Cl. .................... 430/322; 430/325; 430/258; 430/259
(58) Field of Search ................... 430/322, 323, 430/224, 312, 315, 326, 328, 258, 259; 428/198

(56) References Cited

U.S. PATENT DOCUMENTS

| | | | |
|---|---|---|---|
| 3,691,140 | 9/1972 | Silver | 260/78.5 |
| 4,166,152 | 8/1979 | Baker et al. | 428/522 |
| 4,423,401 | * 12/1983 | Mueller | 337/107 |
| 4,786,696 | 11/1988 | Bohnel | 526/88 |
| 5,079,069 | 1/1992 | Howard et al. | 428/209 |
| 5,155,655 | 10/1992 | Howard et al. | 361/303 |
| 5,161,086 | 11/1992 | Howard et al. | 361/321 |
| 5,261,153 | 11/1993 | Lucas et al. | 29/830 |
| 5,347,258 | 9/1994 | Howard et al. | 338/333 |
| 5,466,892 | 11/1995 | Howard et al. | 174/261 |
| 5,528,082 | * 6/1996 | Ho et al. | 257/775 |
| 5,650,339 | * 7/1997 | Saito et al. | 437/21 |
| 5,800,967 | * 9/1998 | Watterston | 430/312 |
| 6,207,522 | 3/2001 | Hunt et al. | 438/393 |

OTHER PUBLICATIONS

U.S. application No. 09/198,954, issue date May 1976, filing date Nov. 24, 1998.

* cited by examiner

*Primary Examiner*—Janet Baxter
*Assistant Examiner*—Yvette M. Clarke

(57) ABSTRACT

To secure a thin film to a rigid carrier for subsequent exposure to processing chemicals, the thin film is initially adhered to the rigid carrier with a light adhesive from which the thin film may later be peeled. Then a photoresist is applied over the thin film extending over a peripheral region of the carrier along the perimeter of the thin film. The photoresist is exposed to actinic radiation in a pattern such that when the photoresist is subsequently developed, a perimeter region of the photoresist remains over the perimeter region of the carrier and extending inward over the periphery of the thin film sufficiently to secure the thin film during conveyorized chemical processing. Finally the resist is stripped to release the thin film and the thin film pealed from the adhesive pattern.

10 Claims, 2 Drawing Sheets

METHOD FOR SECURING AND PROCESSING THIN FILM MATERIALS

The present invention is directed to a method of securing and processing thin film materials such as those used to form embedded electrical components of multi-layer printed circuit boards.

BACKGROUND OF THE INVENTION

There is a continuing interest in printed circuitry miniaturization. In most printed circuit boards in use, circuitry traces are printed by conventional methods, particularly photoresist techniques. Accessory components such as capacitors and resistors are frequently provided as discrete components and soldered onto the printed circuitry, either manually or robotically. These components occupy "real estate" on the printed circuit board and may be difficult or expensive to apply to the board.

Accordingly, structures have been proposed in which components such as capacitors and/or resistors are provided along with circuitry traces by circuitization procedures. Examples of such structures are found in U.S. Pat. Nos. 5,079,069, 5,155,655, 5,161,086, 5,261,153, 5,347,258, and 5,466,892, the teachings of each of which are incorporated herein by reference. Typically, a plurality of such structures are laminated together with dielectric material to form multi-layer printed circuit boards.

Embedded circuitry components including conductive traces, resistors, capacitors, and inductors, and components containing all of the above may be produced by chemically processing thin films. The term "thin film material" is meant herein to encompass single layer films, such as metal foils, as well as thin film laminates such as a laminate of two or more layers having specific electrical properties or a laminate of a support film and one or more layers of material having specific electrical properties.

Because such thin film materials have very little mechanical stability and would not by themselves survive conveyorized chemical processing, they must be supported on a rigid carrier. The thin film material may be held to the carrier by a rigid frame or by tape along its edges. Mechanical frames are labor-intensive to apply and remove. Tape has been known to come off during processing, resulting in damage to the thin film material being processed.

SUMMARY OF THE INVENTION

The invention provides a method of securing a thin film material for conveyorized processing. A rigid carrier is provided which has surface dimensions greater than that of the thin film material such that the thin film may be placed on the surface of the carrier leaving a perimeter area exposed. An adhesive is applied on the surface of the carrier in a pattern designed to adhere at least a peripheral portion of the thin film. This pattern may be along only a portion that secures the periphery of the thin film or over the entire carrier. The adhesive is selected to have greater adherence to the surface of the carrier than to the thin film and to have sufficiently low adhesion to the thin film such that the thin film may later be pealed from the adhesive pattern without damage to the thin film. The thin film is adhered to the adhesive pattern. A photoresist layer is applied over the thin film such that the photoresist layer extends over the exposed perimeter area of the carrier. The photoresist layer is exposed to patterned actinic radiation, the pattern of the actinic radiation being such that in subsequent development of the photoresist layer, a perimeter region of the photoresist remains over the perimeter region of the carrier surface and extends inward over a peripheral portion of the thin film sufficiently to secure the thin film during subsequent processing. The thin film is then chemically processed, typically as it is carried along on a conveyor. After processing, the resist remaining on the film is stripped, thereby releasing the thin film from the peripheral portion of the residual resist. The thin film is then peeled from the adhesive pattern.

DETAILED DESCRIPTION OF CERTAIN PREFERRED EMBODIMENTS

This invention presents a method for processing thin materials through aggressive chemical handling equipment without damage and with minimum handling.

Again, "thin film" and "thin film material" are intended to encompass herein both single layer thin film materials such as thin metal foil or multi-layer laminates. A single layer of foil, such as copper foil, may serve as the thin film material. However, if used to form printed circuitry, any mechanical strength the copper foil may have will be weakened by the circuitization process; thus, generally such a foil would be laminated to a support film for processing. Even with a support film, the laminate still must be supported by a rigid carrier.

U.S. patent application Ser. No. 09/283,100, the teachings of which are incorporated herein by reference, teaches thin film laminate structures for forming capacitors. These include two layer structures of dielectric material, e.g., silica, deposited on metal foil and three-layer structures in which silica is sandwiched between a metal foil layer and a deposited metal layer.

U.S. patent application Ser. No. 09/198,954, the teachings of which are incorporated herein by reference, describes thin film materials for forming embedded resistors. These include resistive material, such as silica-doped platinum, deposited on polyimide film and resistive material deposited on metal foil.

All of the above-described materials, as well as a variety of other conceivable thin film structures are amenable to processing by the method of the invention.

Figure 1:
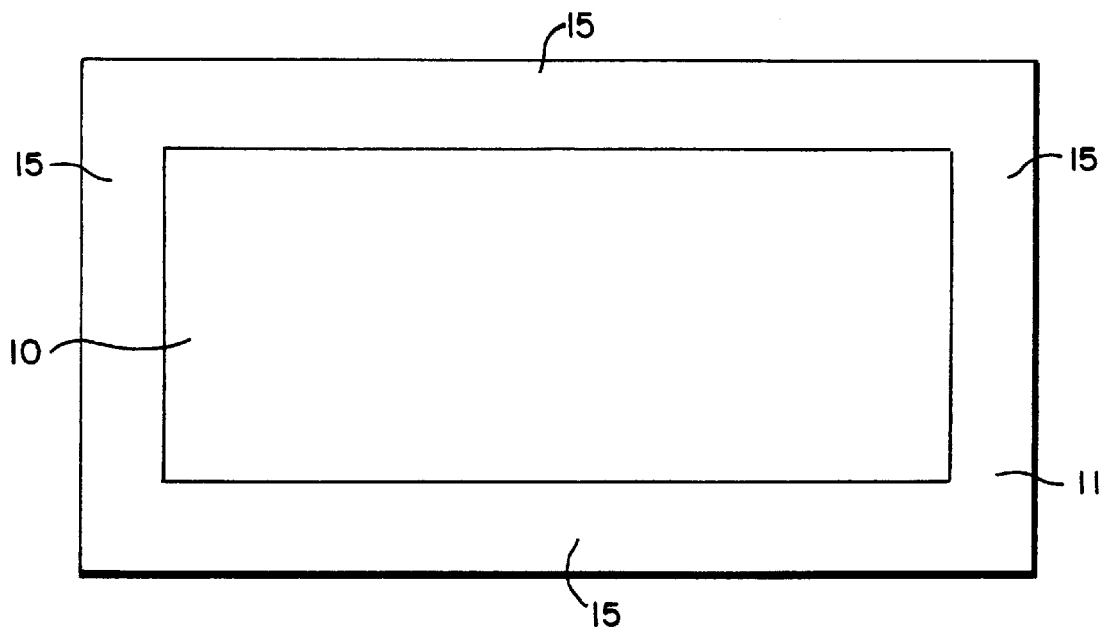
FIG. 1 is plan view of a thin film laminate adhered to a rigid carrier.

Illustrated in FIG. 1 is a thin film 10 which is adhered to a rigid support 11 with a pattern of adhesive 12. For purposes of illustration, but not limitation, the thin film material will be considered to be a layer of copper 14 on a polyimide support sheet 13 (FIG. 2).

The carrier 11 is a structurally rigid material selected to withstand chemical attack during chemical processing of the thin film 10. Suitable materials for the carrier 11 include, but are not limited to fiberglass, phenolic resin structures, glass, and metal plates.

The adhesive 12 is selected to be lightly adhesive so that the thin film 10, after processing, can be removed. The adhesive 12 should be more adhesive to the carrier 11 than to the surface of the thin film 10 to which it adheres so that adhesive does not stick to the final product. Preferably, the adhesive is resistant to the processing chemicals so that the adhesive does not have to be re-applied to the carrier 11 each time a new thin film 10 is applied for processing. A suitable type of adhesive is that used on 3M Post-It® notes; such adhesives being described in U.S. Pat. Nos. 3,691,140, 4,166,152 and 4,786,696, the teachings of each of these being incorporated herein by reference. The adhesive can be applied by known application methods such as spray, roll coating, dipping, etc., or it may be transferred from a tape. As can be seen in FIG. 1, the surface of carrier 11 is of greater dimensions than the thin film 10 such that a perimeter portion 15 of the surface of the carrier 11 borders the thin film 10. The adhesive pattern 12 extends along at least the periphery of the thin film so as to hold the edge but may be applied over the entire region on which the thin film 10 is to lie.

Figure 2:
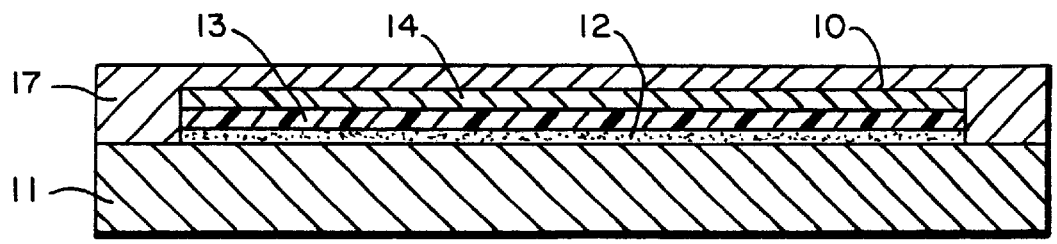
FIG. 2 is a cross-sectional view of the thin film laminate adhered to the rigid carrier with a layer of photoresist applied thereover.

After the thin film 10 is applied to the adhesive, a photoresist layer 17 is applied over the thin film and extending over the perimeter region 15 of the surface of the carrier 11 as seen in FIG. 2. The photoresist may be applied as a liquid or from a dry film by conventional methods. The photoresist may be either negative-acting or positive acting but will be described herein in terms of a negative-acting photoresist.

Figure 3:
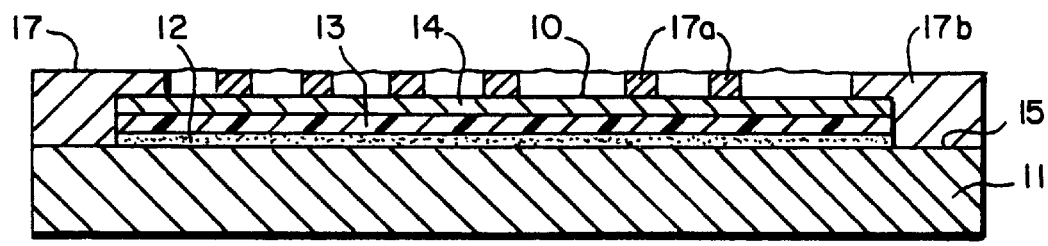
FIG. 3 is a cross-sectional view of the structure of FIG. 2 after it has been exposed to patterned actinic radiation and developed.
Figure 4:
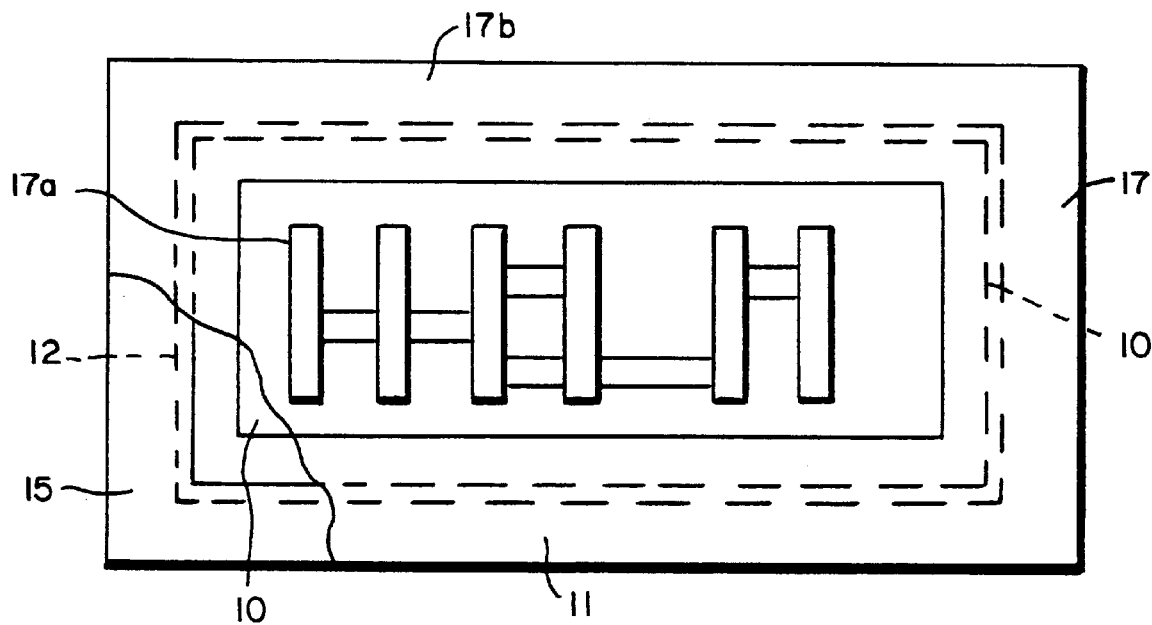
FIG. 4 is a plan view of the structure of FIG. 3.
Figure 5:
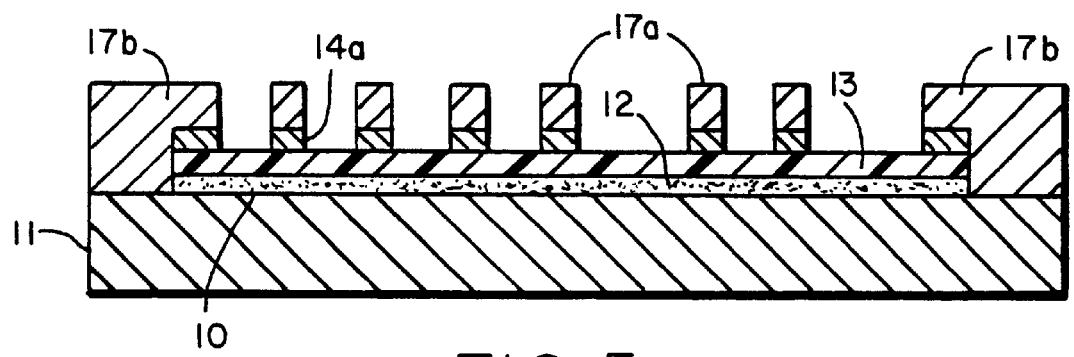
FIG. 5 is a cross-sectional view of the structure of FIG. 4 after the top layer of the thin film laminate has been etched.

The photoresist layer 17 is exposed to patterned actinic radiation through artwork (not shown) rendering exposed portions of the resist insoluble to developer. The artwork is such that in addition to a circuitization pattern 17a remaining in the developed photoresist, a perimeter portion 17b remains over the perimeter portion 15 of the surface of the carrier 11 and extending inward of the edge of the thin film 10 so as to remain as a support "frame" as seen in FIGS. 3 and 4.

Figure 6:
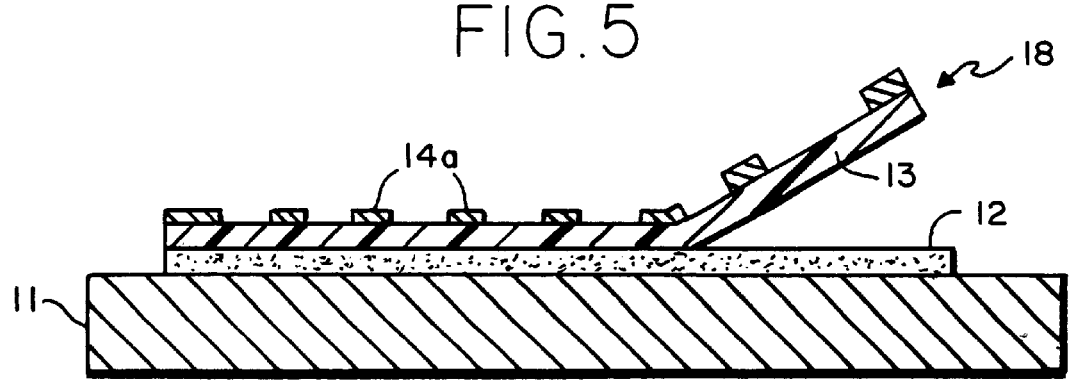
FIG. 6 is a cross-sectional view of the structure of FIG. 5 after the residual resist has been stripped away and shows the circuitized laminate being peeled from the adhesive.

After development, an etchant, such as ferric chloride, is used to etch away exposed portions of the copper leaving circuitry traces 14a. Then the remaining resist is stripped, releasing the edges of the printed circuit 18 (FIG. 6). The printed circuit 14 may be then peeled from the adhesive 12 as shown in FIG. 6 for subsequent processing, such as embedding in a multi layer printed circuit board.

There are a variety of processes to which the invention is applicable, the circuitization process described above being merely illustrative of the invention. As described in above-referenced U.S. patent application Ser. No. 09/283,100, silica, a dielectric material, may be etched with a hydrogen fluoride or fluoroboric acid solution. Above-referenced U.S. patent application Ser. No. 09/198,954 describes an ablative etching procedure whereby a silica-doped platinum resistor layer may be etched from a conductive metal layer by an ablative etching process. The ablative etching process relies on the porous nature of the silica-doped platinum whereby an etchant for the underlying metal layer seeps through the silica-doped platinum layer. As soon as the interface between the metal and the silica-doped platinum is disrupted, and before significant etching of the underlying metal layer occurs, the silica-doped platinum ablates away from those regions where the interface is disrupted. Thus, the invention is applicable to formation of thin film capacitors and resistors in addition to conductive circuitry.

What is claimed is:

1. A method of securing a thin film material for conveyorized processing comprising providing a rigid carrier having surface dimensions greater than that of said thin film such that said thin film may be placed on a surface of said carrier leaving a perimeter area exposed, applying an adhesive on said surface of said carrier in a pattern designed to adhere at least a peripheral portion of said thin film, said adhesive being selected to have greater adherence to said surface of said carrier than to said thin film and having sufficiently low adhesion to said thin film such that said thin film may later be pealed from said adhesive pattern without damage to said thin film, adhering said thin film to said adhesive pattern, applying a photoresist layer over said thin film such that said photoresist layer extends over said exposed perimeter area of said carrier, exposing said photoresist layer to patterned actinic radiation, the pattern of said actinic radiation being such that in subsequent development, a perimeter region of said photoresist remains over said perimeter region of said carrier surface and extends inward over a peripheral portion of said thin film sufficiently to secure said thin film during subsequent processing.

2. A method of processing a thin film comprising securing said thin film to a carrier by the method of claim 1, exposing said carrier-secured thin film to processing chemicals, stripping resist from said carrier-secured thin film to release said thin film from said perimeter region of said photoresist, and pealing said thin film from said adhesive.

3. The method according to claim 1 wherein said photoresist is negative-acting.

4. The method according to claim 1 wherein said photoresist is positive-acting.

5. The method according to claim 1 wherein said thin film is an electrically conductive material.

6. The method according to claim 1 wherein said thin film is a resistive material.

7. The method according to claim 1 wherein said thin film is a dielectric material.

8. The method according to claim 1 wherein said thin film is a laminate comprising a support film layer and at least one layer having desired electrical characteristics.

9. The method according to claim 1 wherein said thin film is a laminate comprising at least two layers having desired electrical characteristics.

10. The method of claim 2 wherein said carrier is resistant to said processing chemicals.

\* \* \* \* \*